United States Patent
Kaneko et al.

(10) Patent No.: US 6,966,946 B2
(45) Date of Patent: Nov. 22, 2005

(54) CRYSTAL PRODUCTION METHOD FOR GALLIUM OXIDE-IRON MIXED CRYSTAL

(75) Inventors: Yoshio Kaneko, Chiba (JP); Yoshinori Tokura, Tokyo (JP); Shigeki Miyasaka, Tokyo (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/494,357

(22) PCT Filed: Oct. 11, 2002

(86) PCT No.: PCT/JP02/10601

§ 371 (c)(1),
(2), (4) Date: May 11, 2004

(87) PCT Pub. No.: WO2004/016837

PCT Pub. Date: Feb. 26, 2004

(65) Prior Publication Data

US 2004/0255844 A1 Dec. 23, 2004

(30) Foreign Application Priority Data

Aug. 12, 2002 (JP) .............................. 2002-234708

(51) Int. Cl.$^7$ ............................................ C30B 15/20
(52) U.S. Cl. .............................. 117/49; 117/50; 117/51
(58) Field of Search ................................ 117/49, 50, 51

(56) References Cited

U.S. PATENT DOCUMENTS 6,165,263 A 12/2000 Sekijima et al.

OTHER PUBLICATIONS

Yu. F. Popov et al., Linear Magnetostriction and Magnetoelectric Effect in Piezoelectric $Ga_{2-x}Fe_xO_3$ Ferroelectrics. 1997, vol. 204, No. 1-4, pp. 269 to 277.

Primary Examiner—Felisa Hiteshew
(74) Attorney, Agent, or Firm—Oblon, Spivak, McClelland, Maier & Neustadt, P.C.

(57) ABSTRACT

A manufacturing method of a $Ga_{2-x}Fe_xO_3$ crystal is provided which can form a superior, uniform, and large crystal.

By a floating zone melting method in which ends of material bars (3, 5), which are disposed at an upper and a lower position and which are composed of $Ga_{2-x}Fe_xO_3$, are heated in a gas atmosphere with halogen lamps (6, 7) disposed at confocal areas so as to form a floating melting zone between the ends of the material bars (3, 5) which are disposed at the upper and the lower position and which are composed of $Ga_{2-x}Fe_xO_3$, $Ga_{2-x}Fe_xO_3$ a single crystal having an orthorhombic crystal structure is formed.

12 Claims, 7 Drawing Sheets

Ga1 (Regular Tetragon)

Ga2 (Octagon)

Fe3, 4 (Octagon)

Oxygen

F I G. 8

CRYSTAL PRODUCTION METHOD FOR GALLIUM OXIDE-IRON MIXED CRYSTAL

TECHNICAL FIELD

The present invention relates to crystal manufacturing methods of a gallium iron oxide mixed crystal ($Ga_{2-x}Fe_xO_3$) capable of reading spin information embedded in a solid using magneto-electric properties.

BACKGROUND ART

The fact that a $Ga_{2-x}Fe_xO_3$ crystal has magneto-electric properties has been described by Yu. F. Popov et al., in [JETP 87(1), 146(1998)], and in recent years, this material has drawn attention as a first material having polarization as well as ferromagnetism.

However, since the crystal size of a $Ga_{2-x}Fe_xO_3$ crystal which can be manufactured by a conventional manufacturing method has been too small, approximately 1 mm in diameter, to be used in practice, of course, the crystal has not been used in practice, and furthermore, the properties thereof have not been evaluated as of today.

The conventional manufacturing method of a $Ga_{2-x}Fe_xO_3$ crystal is a crystal formation method in accordance with a flux method [I. S. Jacos; Journal of Applied Physics; Vol. 31, No. 5 263S (1960)].

According to this method, a crystal is obtained by the steps of mixing appropriate amounts of $Ga_2O_3$, $Fe_2O_3$, $B_2O_3$, and $Bi_2O_3$; holding a liquid melted in $B_2O_3$ and $Bi_2O_3$ at 1,125° C. for five hours; and then performing slow cooling at a rate of 4 to 7° C./Hr. The crystal obtained by this method is a small crystal having a diameter of approximately 1 mm [Elizabeth A. Wood; Acta Cryst. 13, 682 (1960)].

In accordance with the flux method described by I. S. Jacos, the inventors could obtain a crystal; however, the crystal thus obtained was small as described above, and a crystal having a diameter of up to several millimeters could not be obtained. In addition, it was also found that there have been the following problems. That is, in the above manufacturing method of a $Ga_{2-x}Fe_xO_3$ crystal, a targeted Fe composition (X) of $Ga_{2-x}Fe_xO_3$ is generally determined by a mixing ratio between $Ga_2O_3$ and $Fe_2O_3$, which are used as starting materials.

However, the actual Fe composition (x) of a fine crystal obtained by the flux method described above was different from an expected composition. That is, according to an inductively coupled plasma (ICP) analytical result, it was found that, although a targeted mixing ratio x was 1.08, x of the composition actually obtained was 1.12. Since the difference in composition thus described has a significant influence on a temperature Tc at which the transition to ferrimagnetism occurs (see FIG. 8), the fact that a targeted Tc cannot be controlled is a serious problem.

In addition, variation in composition among a plurality of $Ga_{2-x}Fe_xO_3$ crystals formed by a flux method may occur at high probability, and as a result, a problem may arise when Tc's of a plurality of crystal grains thus formed are controlled.

Furthermore, according to the result of X-ray analysis, a plurality of diffraction lines was observed in a sample which was believed to be one crystal, and hence it was confirmed that the crystal described above is liable to have a twin structure. For a $Ga_{2-x}Fe_xO_3$ crystal having strong magnetic anisotropy, this twin structure is a fatal disadvantage.

By the reasons described above, the $Ga_{2-x}Fe_xO_3$ crystal formed by a flux method was not only small but was also hardly used for industrial applications in view of the crystal quality thereof.

DISCLOSURE OF INVENTION

As described above, as the problems of a flux method which is a conventional manufacturing method of a $Ga_{2-x}Fe_xO_3$ crystal, the following may be mentioned.

① The manufactured crystal is a small crystal having a crystal size of approximately 1 mm.

② The obtained crystal is not a single crystal, single crystal grains having at least two different orientations are formed in many cases, and a twin structure is frequently observed.

③ Although a great number of crystal grains can be formed, the Fe composition (x) of each crystal grain is different from a targeted composition, and in addition, variation (at least approximately several percents) in Fe composition (x) among the crystal grains exists. The fact described above has an influence on a ferrimagnetic transition temperature Tc of an obtained material, and the variation in Tc is up to several tens degrees Celsius.

④ As the result of the above ③, the variation in basic properties of an element occurs when it is practically used and becomes a serious interference with practical usage of the element.

In consideration of the situation described above, an object of the present invention is to provide a crystal manufacturing method of a gallium iron oxide mixed crystal, which can form a superior, uniform, and large crystal.

In order to achieve the object described above, according to the present invention:

[1] a crystal manufacturing method for manufacturing a gallium iron oxide mixed crystal ($Ga_{2-x}Fe_xO_3$), comprises the steps of: disposing material bars each composed of $Ga_{2-x}Fe_xO_3$ at an upper position and a lower position; and heating ends of the material bars in a gas atmosphere with heat sources disposed at confocal areas in accordance with a floating zone melting method so as to form a floating melting zone between the ends of the material bars which are disposed at the upper position and the lower position and which are composed of the $Ga_{2-x}Fe_xO_3$, whereby a $Ga_{2-x}Fe_xO_3$ single crystal having an orthorhombic crystal structure is formed.

[2] In the $Ga_{2-x}Fe_xO_3$ crystal manufacturing method described in the above [1], the range of the Fe composition (x) of the $Ga_{2-x}Fe_xO_3$ crystal satisfies $0.7 \leq x \leq 1.5$, whereby the $Ga_{2-x}Fe_xO_3$ single crystal having an orthorhombic crystal structure is formed.

[3] In the $Ga_{2-x}Fe_xO_3$ crystal manufacturing method described in the above [2], when the range of the Fe composition (x) satisfies $0.7 \leq x \leq 1$ in oxygen, air, or an inert gas atmosphere, the $Ga_{2-x}Fe_xO_3$ single crystal having an orthorhombic crystal structure is formed at a high pressure of three atmospheres or more.

[4] In the $Ga_{2-x}Fe_xO_3$ crystal manufacturing method described in the above [2], when the range of the Fe composition (x) satisfies $0.7 \leq x \leq 1.5$ in oxygen, air, or an inert gas atmosphere, the $Ga_{2-x}Fe_xO_3$ single crystal having an orthorhombic crystal structure is formed at a high pressure of five atmospheres or more.

[5] In the $Ga_{2-x}Fe_xO_3$ crystal manufacturing method described in the above [3] or [4], the crystal growth rate is controlled to be 10 mm/Hr or less, whereby the $Ga_{2-x}Fe_xO_3$ single crystal having an orthorhombic crystal structure is formed.

[6] In the $Ga_{2-x}Fe_xO_3$ crystal manufacturing method described in the above [5], the feed rate of the material bar for crystal growth is controlled to be 20 mm/Hr or less, whereby the $Ga_{2-x}Fe_xO_3$ single crystal having an orthorhombic crystal structure is formed.

BEST MODE FOR CARRYING OUT THE INVENTION

Hereinafter, an embodiment of the present invention will be described in detail with reference to drawings.

Figure 1:
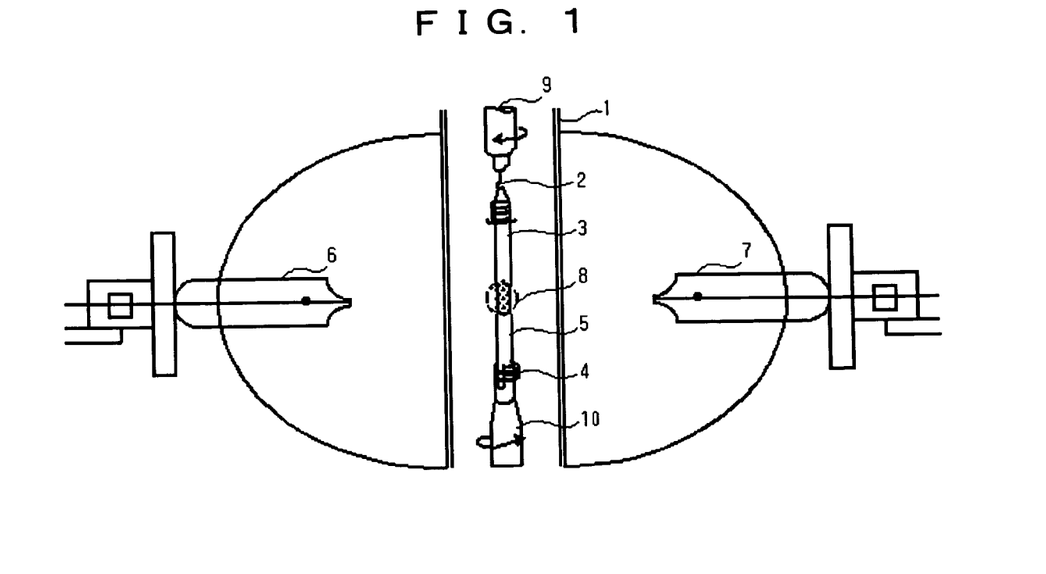
FIG. 1 is a schematic view of a floating zone melting type lamp heating furnace of an example according to the present invention.
Figure 2:
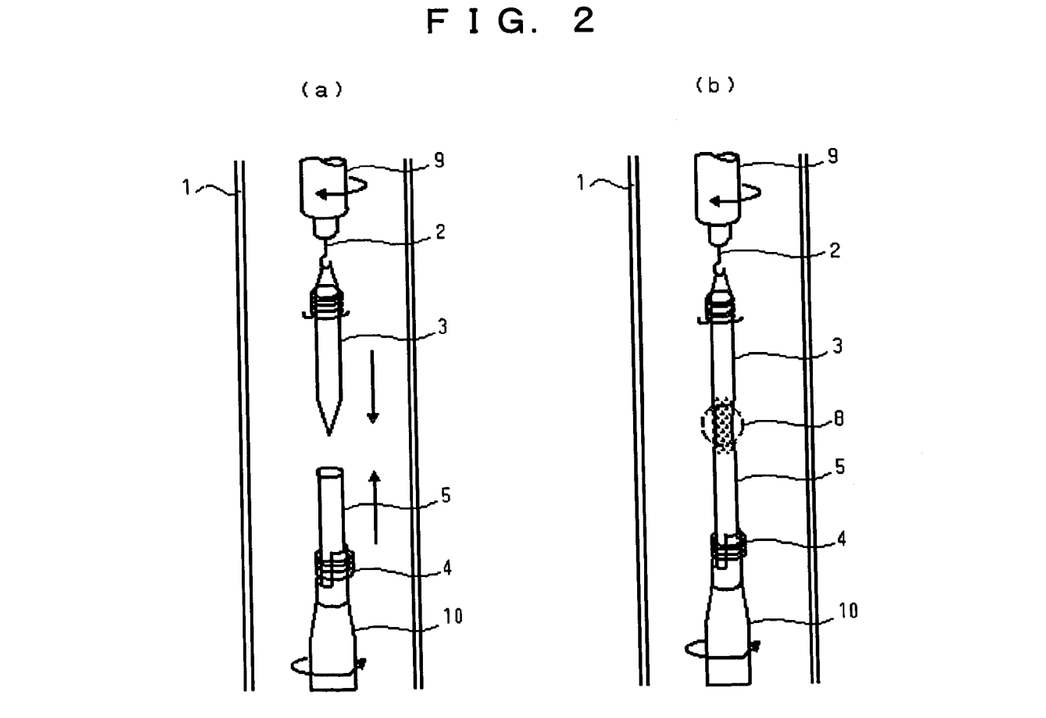
FIG. 2 includes explanatory views each showing a floating zone melting type manufacturing method of a $Ga_{2-x}Fe_xO_3$ crystal of an example according to the present invention.

FIG. 1 is a schematic view of a floating zone melting type lamp heating furnace used for manufacturing a $Ga_{2-x}Fe_xO_3$ crystal according to the present invention, and FIG. 2 includes explanatory views each showing a manufacturing method of a $Ga_{2-x}Fe_xO_3$ crystal by the floating zone melting method described above. In this embodiment, a heating furnace is shown which has confocal type lamps at two sides.

In the figures described above, reference numeral 1 indicates a transparent quartz tube used as a chamber in which a $Ga_{2-x}Fe_xO_3$ crystal is grown, and inside this transparent quartz tube 1, an upper material bar (feeder) 3, which is hung from an upper stainless steel shaft 9 with a kanthal wire 2, and a lower material bar (seed crystal: seed) 5, which is fitted to a lower stainless steel shaft 10 with a kanthal wire 4, are rotatably provided. In the transparent quartz tube 1, an oxygen atmosphere is formed; however, an air atmosphere or an inert gas atmosphere may also be formed. Reference numerals 6 and 7 indicate heat sources (in this embodiment, halogen lamps) placed at confocal points of the lamp heating furnace, which confocal points are located at two sides of the transparent quartz tube 1, and reference numeral 8 indicates a floating melting zone. In addition, the upper and lower material bars 3 and 5 described above are each formed of $Ga_{2-x}Fe_xO_3$ used as a starting material.

Next, a crystal growth method of $Ga_{2-x}Fe_xO_3$, according to the present invention, will be described.

First, a solid bar, which is formed from a powder made of $Ga_{2-x}Fe_xO_3$ used as a starting material by compression molding, is divided into two pieces to form the feeder 3 and the seed 5, and they are provided for the upper and the lower stainless steel shafts 9 and 10, respectively, in the quartz tube 1 as shown in FIG. 2(a). The upper material bar (feeder) 3 is hung vertically from the end of the stainless shaft 9 at the upper side with the kanthal wire 2. As is the case described above, the lower material bar (seed) 5 is also fixed to the stainless steel shaft 10 with the kanthal wire 4. The upper and the lower material bars 3 and 5 are fixed so that the axes thereof coincide with the central axes of the stainless steel shafts 9 and 10 as precise as possible, and when zone melting is performed, the upper and the lower stainless steel shafts 9 and 10 are rotated in directions opposite to each other.

Next, the heat sources (halogen lamps) 6 and 7 are turned on in an oxygen atmosphere. Luminescent images of the halogen lamps 6 and 7 are formed on a bottom end of the upper material bar (feeder) 3, and when currents for turning on the halogen lamps 6 and 7 are being increased while the end image of the upper material bar 3, which is rotated, is observed through an observation window (not shown), the bottom end of the upper material bar 3 begins to melt.

When the lower material bar 5 is gradually moved toward the end of the upper material bar 3 in the state described above while being rotated in an opposite direction, the top end of the lower material bar 5 is also put in a melted state, and as shown in FIG. 2(b), the melting portions at the two ends are finally brought into contact with each other, thereby forming the floating melting zone 8 therebetween.

When being handled with care as described below, the floating melting zone 8 thus formed can be present in a stable state between the lower material bar 5 and the upper material bar 3. Accordingly, when the entirety is moved down vertically with respect to a high temperature portion located at a predetermined position, the melting portion starting from the end of the lower material bar 5 is moved upward in the upper material bar 3. In order to stabilize the floating melting zone 8, first, it is important that an appropriate temperature be set and maintained at the melting portion. When the temperature is too high, since the viscosity is decreased, the floating melting zone is liable to hang downward, and the melting portion becomes unstable.

In addition, in order to hold the floating melting zone at a position along the central axes of the shafts 9 and 10 and to make the temperature uniform, a melting portion heated to an appropriately high temperature must be held between the ends of the upper and the lower material bars 3 and 5 which are rotated in directions opposite to each other. Hence, since the material must have appropriate fluidity and viscosity at the melting portion, while the melting portion is being carefully observed, the currents for turning on the halogen lamps 6 and 7, the distance between the bottom end of the upper material bar 3 and the top end of the lower material bar 5, the descending rate, and the like are adjusted. In addition, since the melting portion becomes thin by evaporation, in order to compensate for the loss caused thereby, the descending rate of the upper material bar 3 must be increased as compared to that of the lower material bar 5.

The growth direction of the crystal thus obtained does not always coincide with the central axis of a lower part of the shaft. Accordingly, the obtained single crystal is used as the material bar 5, a solid bar formed by powder compression molding is fixed to the feeder 3, and a single crystal is then grown. In this step, the growth direction of the single crystal must be fixed so as to coincide with the central axis of the lower part of the shaft. By the procedure described above, a single crystal having a size of several centimeters or more can be first stably manufactured.

An orthorhombic crystal of $Ga_{2-x}Fe_xO_3$ is manufactured by a floating zone melting type crystal manufacturing apparatus as described above.

This floating zone melting type (floating zone melting method) can form a melting zone without using a crucible, and hence this is a superior method since intrusion of impurities contained in a crucible can be prevented. By the method described above, a crystal having a practically usable size can be manufactured.

Figure 3:
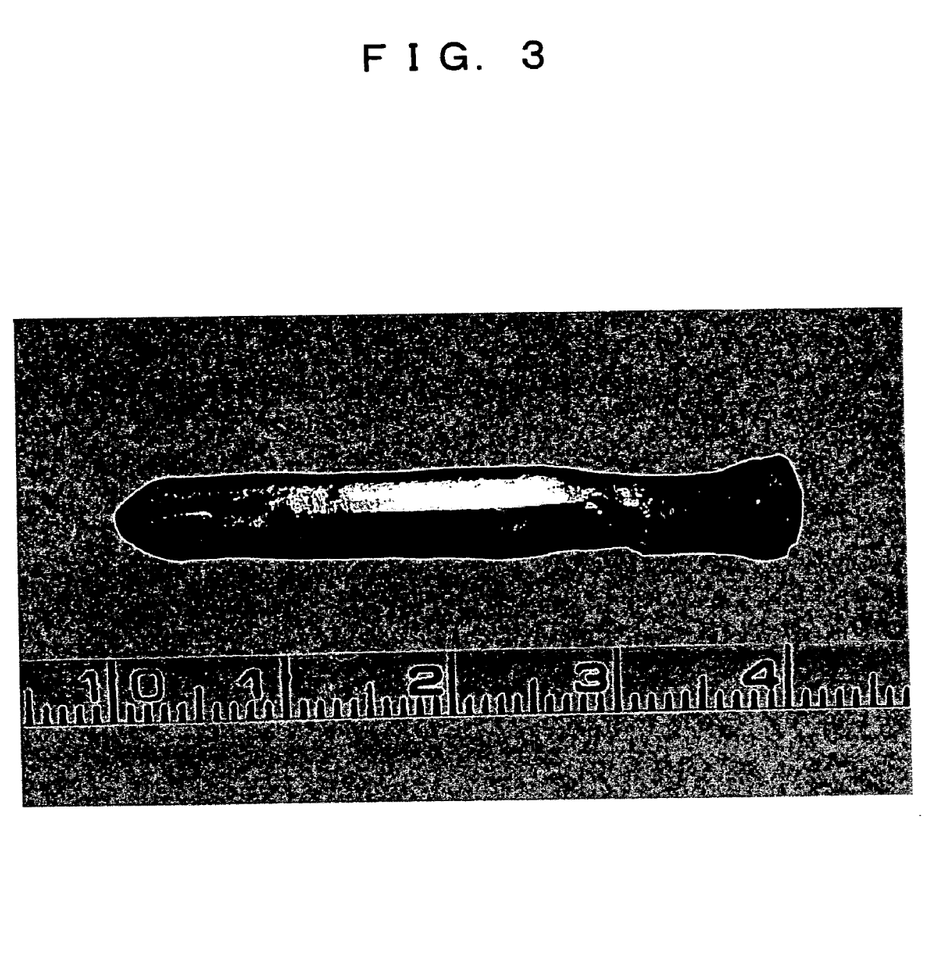
FIG. 3 is a view showing a $Ga_{2-x}Fe_xO_3$ (x=1) crystal of an example according to the present invention.

FIG. 3 is a view showing a $Ga_{2-x}Fe_xO_3$ (x=1) crystal of an example according to the present invention.

In this figure, the obtained $Ga_{2-x}Fe_xO_3$ crystal has a diameter of several millimeters and a length of several centimeters.

Hereinafter, the crystal growth conditions therefor will be described.

(1) Oxygen Atmosphere (Pressure Conditions); When the range of the Fe (iron) composition (x) satisfies $0.7 \leq x \leq 1$, a pressure of at least three atmospheres is necessary in order to obtain an orthorhombic structure. In general, the growth was performed at eight atmospheres.

When $0.7 \leq x \leq 1.4$ is satisfied $0.7 \leq x \leq 1$, a pressure of at least five atmospheres is necessary in order to obtain an orthorhombic structure. In general, the growth was performed at 10 atmospheres.

X-ray diffraction patterns of crystals under the pressure conditions described above are shown in FIGS. 4 and 5.

Figure 4:
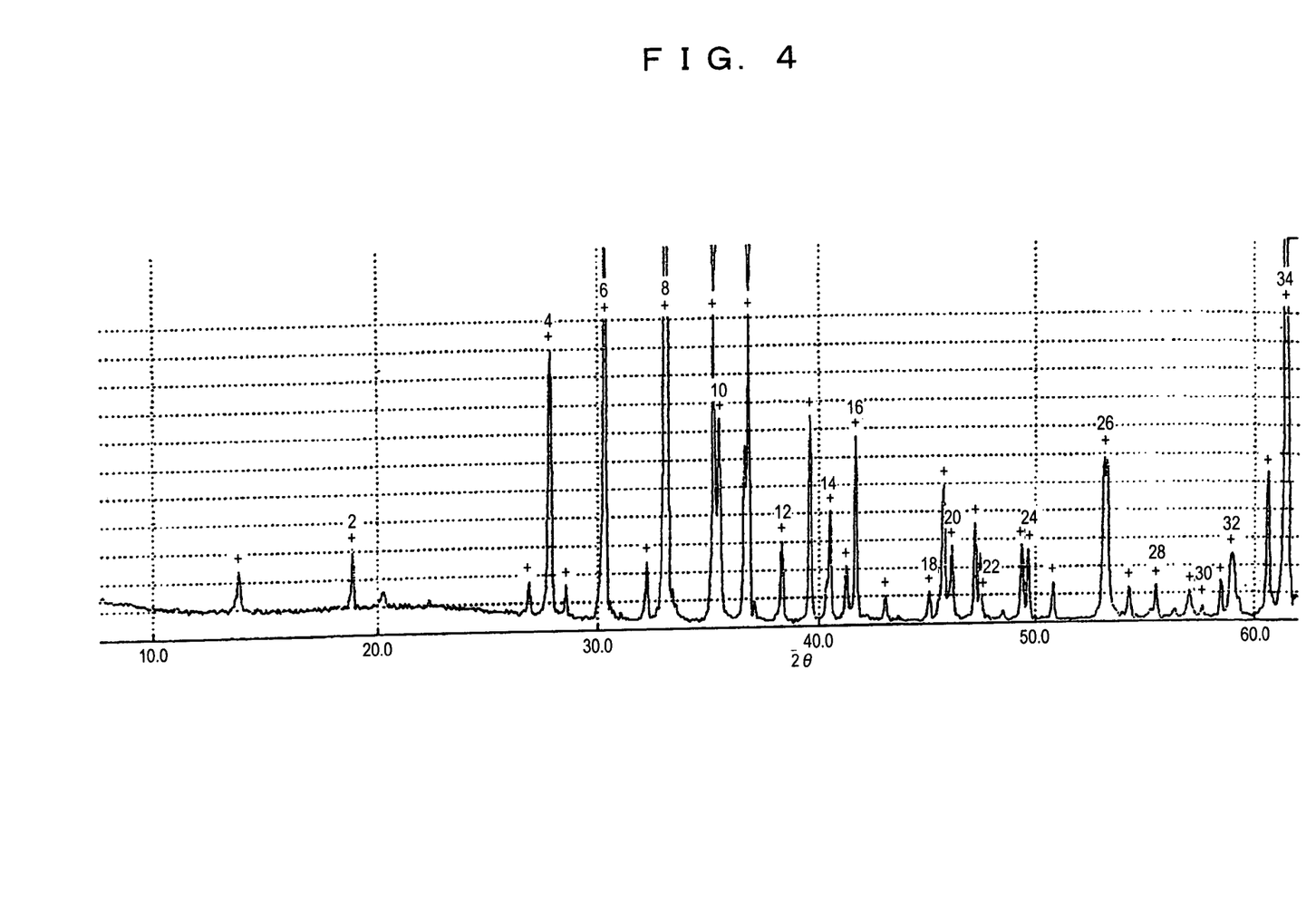
FIG. 4 is a view showing an X-ray diffraction pattern of a $Ga_{2-x}Fe_xO_3$ crystal (x=1) of an example according to the present invention.

FIG. 4 shows an X-ray diffraction pattern of a $Ga_{2-x}Fe_xO_3$ crystal (x=1), and it is understood that an orthorhombic structure was surely obtained.

Figure 5:
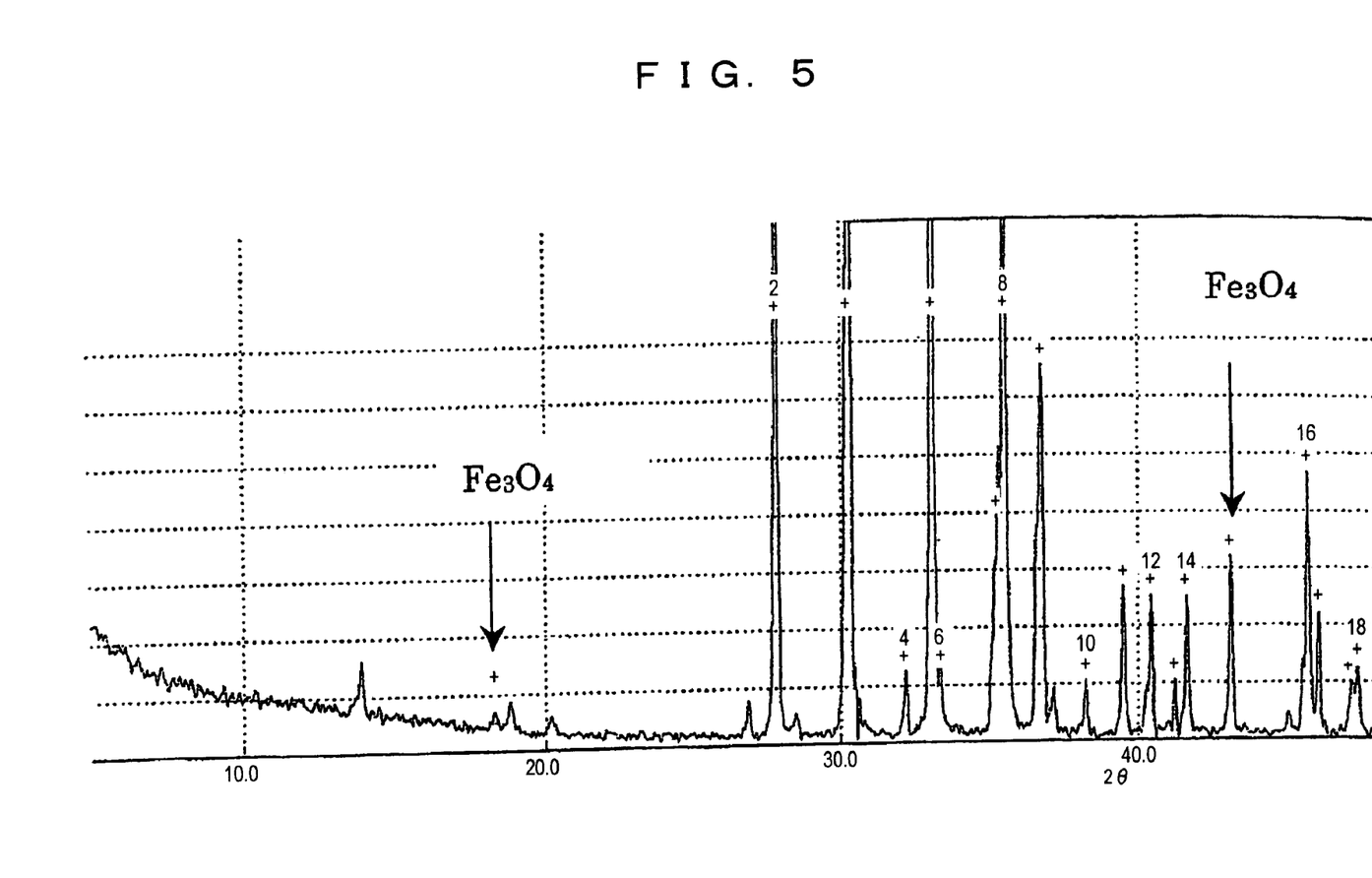
FIG. 5 is a view showing an X-ray diffraction pattern of a $Ga_{2-x}Fe_xO_3$ crystal (x=1) containing $Fe_3O_4$ according to a comparative example.

An X-ray diffraction pattern of a $Ga_{2-x}Fe_xO_3$ crystal (x=1) which was grown at an atmospheric pressure is shown in FIG. 5 for comparison. In the crystal grown at an atmospheric pressure, X-ray lines of an impurity $Fe_3O_4$ are observed, and hence it is understood that the crystal grown at an atmospheric pressure is not a single orthorhombic structure.

The crystal described above has a property adhering to a magnet at room temperature, and hence, from this phenomenon, it is easily understood that a different structure was formed.

(2) Growth Rate; 1.5 mm/Hr (upper limit of 10 mm/Hr)

When the growth rate is 20 mm/Hr or more, an X-ray pattern as shown in FIG. 5 described above is observed. In addition, even when the above mentioned pattern is not observed, since the crystal adheres to a magnet, the presence of a small amount of an $Fe_3O_4$ structure can be understood.

In addition, when the growth rate is increased since the material bar must be cut off from the floating melting zone at the end of the growth, intrusion of $Fe_3O_4$ may occur. Hence, the upper limit is preferably set to 10 mm/Hr. Since the intrusion of $Fe_3O_4$ can be easily judged when the adhesion of a magnet is examined, in this case, a crystal end to which a magnet adheres may be cut off with a diamond cutter.

(3) Feed Rate of Material Bar; 1.5 to 2.0 mm/Hr (upper limit of 20 mm/Hr)

When the feed rate of the material bar is high, the floating melting zone becomes unstable, and a crystal structure of $Fe_3O_4$ or the like is also formed. The upper limit is preferably set to 20 mm/Hr.

Figure 6:
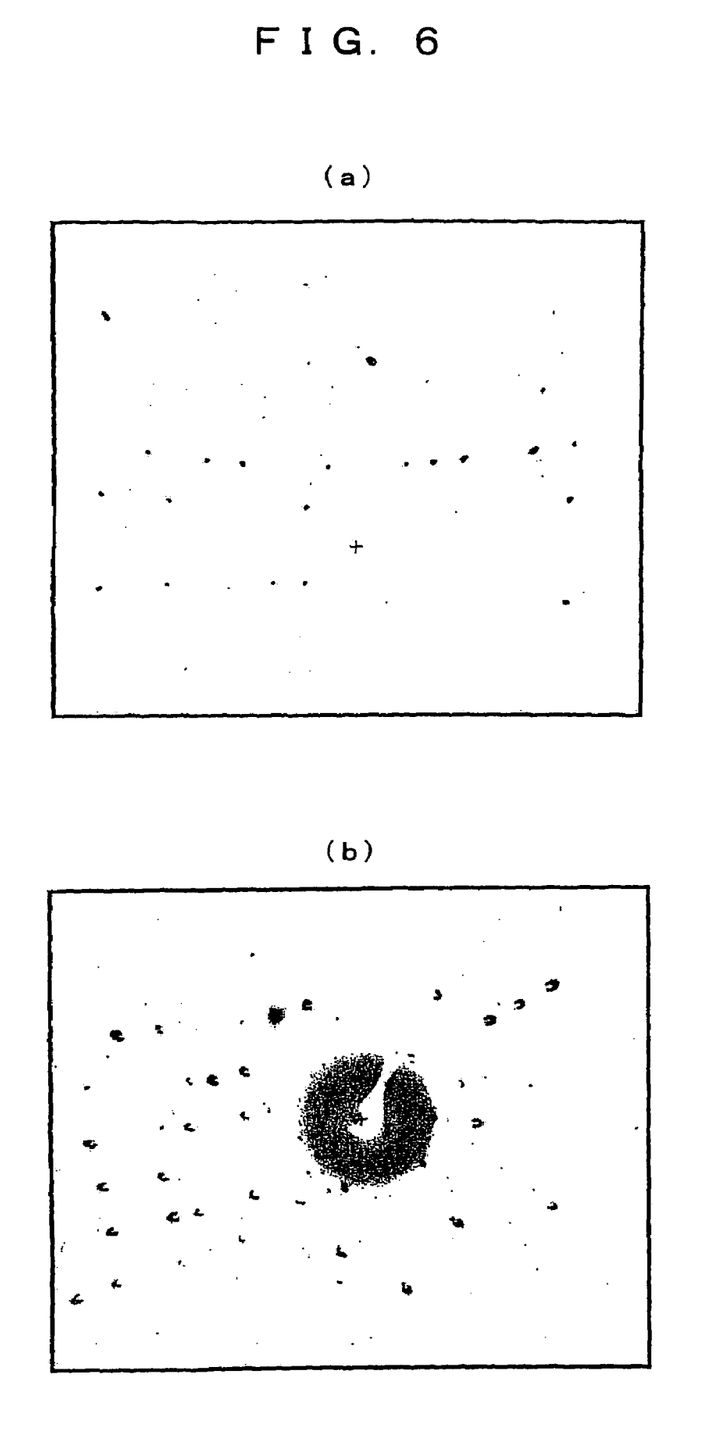
FIG. 6 includes views showing Laue patterns of a crystal formed by a floating zone melting method according to the present invention and a crystal formed by a conventional flux method.

Next, Laue patterns of crystals formed by a floating zone melting method according to the present invention and by a conventional flux method are shown in FIG. 6.

As shown in FIG. 6(a), a Laue pattern of a crystal obtained by a floating zone melting method is observed as a single point, and on the other hand, as shown in FIG. 6(b), a Laue pattern of a flux crystal is observed as a plurality of points. When a different part of the flux crystal is irradiated with an X-ray, a pattern different from the above Laue pattern of the flux crystal is observed. Hence it is clearly understood that the flux crystal is not a single crystal and is a twin.

From the X-ray analytical results, when an Fe composition (x) having an orthorhombic structure satisfies x=1, it is understood that the orthorhombic structure has the following lattice constants represented in accordance with a $Pc2_1n$ system (an angle formed by a, b, and c axes being 90°):

a=8.7512 A,
b=9.3993 A, and
c=5.0806 A.

Figure 7:
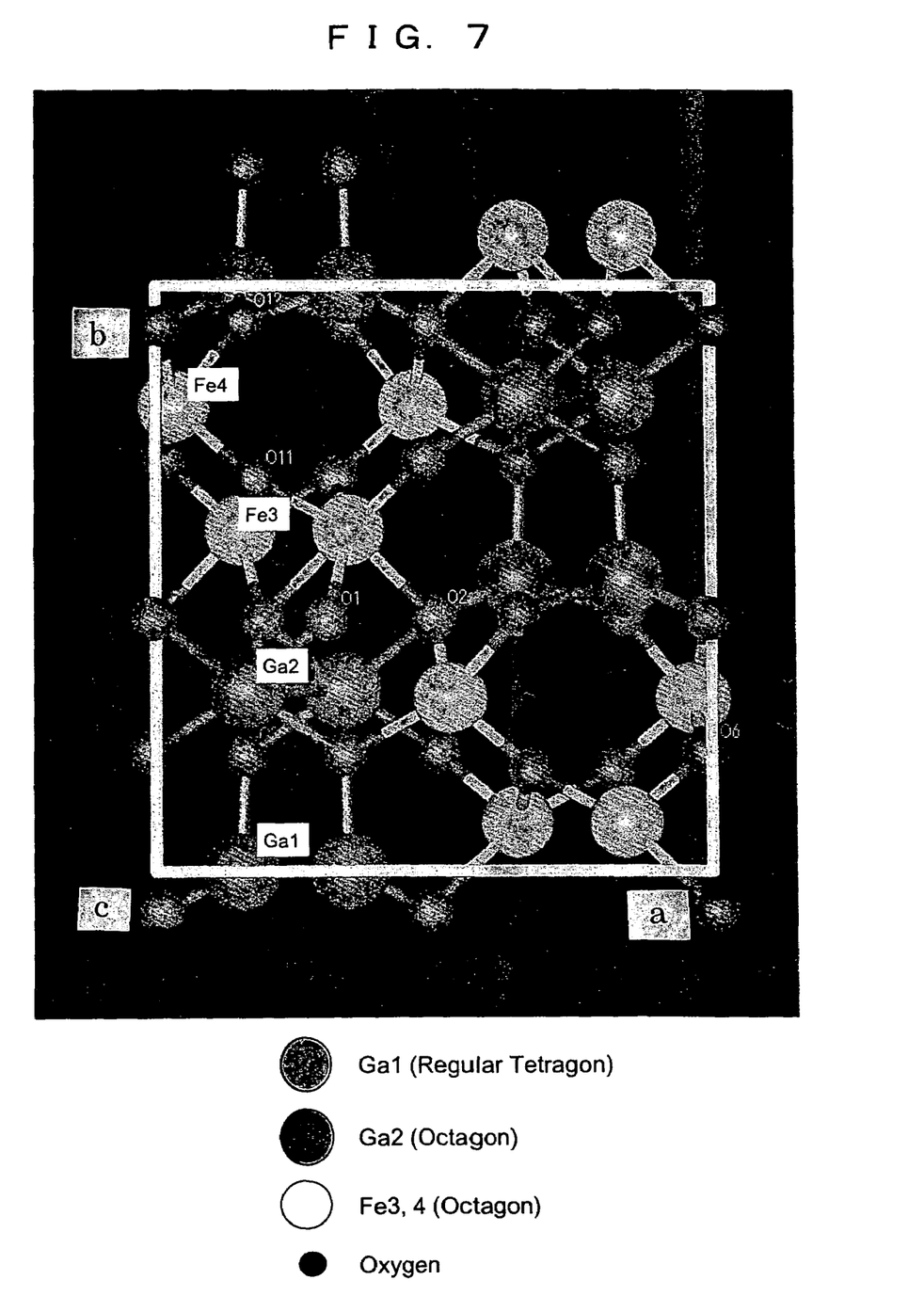
FIG. 7 is a view showing atomic arrangement of a crystal structure formed by a floating zone melting method according to the present invention.

Results of X-ray analysis of these crystals are shown in FIG. 7. FIG. 7 shows an atomic arrangement of these crystal structures when viewed from an ab plane. Ga1 is surrounded by a regular tetrahedron formed of oxygen atoms. Ga2 is surrounded by a regular octahedron formed of oxygen atoms. Fe1 and Fe2 have structures each surrounded by a regular octahedron formed of oxygen atoms. The magnetic properties of this crystal are determined primarily by an exchange interaction between electron spins of Fe1 and Fe2 through oxygen atoms. According to neutron diffraction experimental results, an Fe3 spin and an Fe4 spin are opposite to each other and are in directions approximately close to the a axis. It has been understood that when these spins are inclined to the c axis to a certain extent, weak ferromagnetic properties are exhibited.

Figure 8:
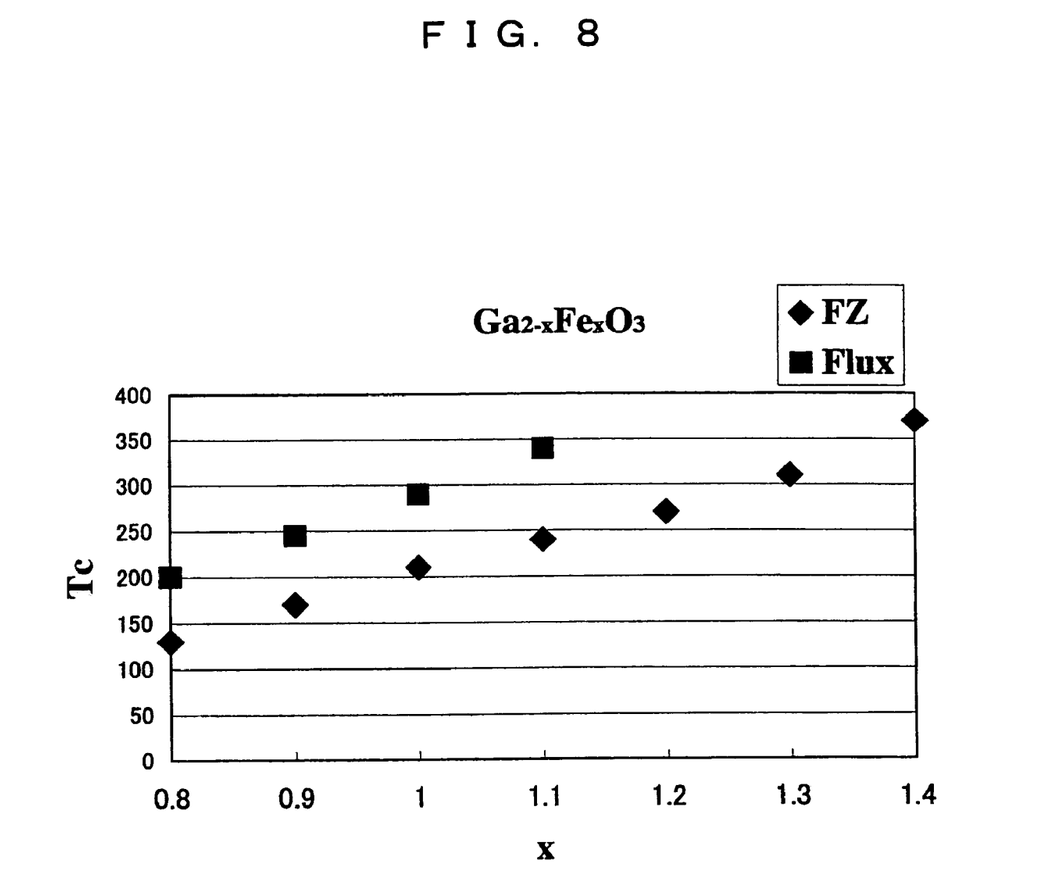
FIG. 8 is a view showing the Fe composition dependence of a ferrimagnetic transition temperature Tc.

FIG. 8 is a view showing the Fe composition dependence of a ferrimagnetic transition temperature Tc. In this figure, ♦ indicates data obtained by a floating zone melting method of the present invention, and ■ indicates data obtained by a conventional flux method.

The Tc by the floating zone melting method is 130K when the Fe composition satisfies x=0.8 and is 360K when x=1.4 is satisfied. As described above, the Tc greatly depends on the Fe composition, and it is understood that this dependence is the character of this crystal.

In particular, when x is approximately 1.3, the Tc becomes 300K. Since the transition temperature can be increased to approximately room temperature, a practically significant advantage can be obtained.

As described above, according to the present invention,

[1] by a floating zone melting type crystal manufacturing apparatus, a $Ga_{2-x}Fe_xO_3$ crystal having an orthorhombic structure can be manufactured, and in addition, since a floating melting zone can be formed by a floating zone melting method without using a crucible, intrusion of impurities contained in a crucible can be prevented. According to the method described above, a crystal having a large size sufficient for a practical use can be manufactured.

[2] In the $Ga_{2-x}Fe_xO_3$ crystal, a single crystal having an orthorhombic crystal structure, in which the Fe (iron) composition (x) satisfies $0.7 \leq x \leq 1.5$, can be manufactured. A large crystal having an orthorhombic structure in the aforementioned Fe composition range can be manufactured by a floating zone melting method.

[3] By manufacturing a crystal in an oxygen atmosphere or an air atmosphere at a high pressure of three atmospheric pressure or more when the Fe composition (x) satisfies $0.7 \leq x \leq 1$ or at a high pressure of five atmospheric pressure or more when $1 \leq x \leq 1.5$ is satisfied, growth of a crystal having a trigonal (rhombohedral) structure or an $Fe_3O_4$ (Cubic; Magnetite) structure can be stably suppressed. In the region in which the Fe composition x is large, application of a high pressure becomes particularly important.

When a crystal contains a trigonal (rhombohedral) structure (a $Ga_2O_3$ crystal and an $Fe_2O_3$ crystal are crystals each having a trigonal structure) or $Fe_3O_4$ (Cubic; Magnetite), magnetism is exhibited. Accordingly, the manufactured crystal described above can be discriminated since it easily adheres to a magnet at room temperature.

[4] In the $Ga_{2-x}Fe_xO_3$ crystal, when the crystal is manufactured while the crystal growth rate is controlled to be 10 mm/Hr or less, the growth of a crystal having a trigonal (rhombohedral) structure or an $Fe_3O_4$ (Cubic; Magnetite) structure can be stably suppressed. In addition, as is the case described above, whether or not the crystal thus manufactured has a trigonal (rhombohedral) structure or $Fe_3O_4$ (Cubic; Magnetite) can be easily discriminated whether it adheres to a magnet or not.

[5] In the $Ga_{2-x}Fe_xO_3$ crystal, when the crystal is manufactured while the feed rate of the material for crystal growth is controlled to be 20 mm/Hr or less, the growth of a crystal having a trigonal (rhombohedral) structure or an $Fe_3O_4$ (Cubic; Magnetite) structure can be stably suppressed.

In addition, according to the present invention, a crystal material capable of reading spin information embedded in a solid can be provided as a material having a magneto-electric effect which is used as a central portion of a magnetic sensor device. Accordingly, a sensor can be realized which senses a very small amount of magnetism with high sensitivity using a magneto-electric effect. This may be used as a highly sensitive magnetic sensor mounted in a magnetic head.

In addition, when being used as a magnetic sensor, the crystal must be cut along an appropriate orientation; however, when being determined once, the crystal orientation can then be easily determined.

In addition, since a magnetic field can be sensed without using a conventional coil shape, miniaturization of a magnetic sensor can be realized, and a fine structure for spin can be formed, a sensor can be provided which may be used for a high density magnetic memory to be developed in future.

The present invention is not limited to the above examples, and various modifications may be made in accordance with the scope of the present invention and are not excluded from the range of the present invention.

As described above, according to the present invention, the following advantages can be obtained.

A $Ga_{2-x}Fe_xO_3$ orthorhombic single crystal having a size of several millimeters can be obtained. This size is determined by the structure of a floating zone melting type lamp heating furnace. When being used as a magnetic sensor device, the crystal must be cut along an appropriate orientation: however, when being determined once, the crystal orientation can then be easily determined.

Since spin configuration embedded in a sold can be sensed using a magneto-electric effect, a novel type magnetic head which has not existed before can be provided. A magnetic field can be sensed without using a conventional coil shape, the miniaturization of a magnetic sensor can be realized, and as a result, a fine structure for spin can also be formed. Hence, a sensor can be provided which may be used for a high density magnetic memory to be developed in future.

INDUSTRIAL APPLICATION

The present invention relates to a manufacturing method of a crystal material which is capable of reading spin information embedded in a solid and which is used as a central portion of a magnetic sensor device. In particular, the material by the method described above may be used for a sensor which senses a very small amount of magnetism with high sensitivity using a magneto-electric effect.

What is claimed is:

1. A method of manufacturing a single crystal of gallium iron oxide, comprising the steps of:

in a transparent tubular chamber in a vertical position, coaxially positioning an upper material bar and a lower material bar, each of gallium iron oxide, so that the lower end of the upper material bar directly opposes the upper end of the lower material bar in non-contacting relationship;

rotating the upper material bar about its axis in a direction and exposing the lower end of the rotating upper material bar to light at the confocal areas of two opposed light sources, thereby melting the lower end of the upper material bar;

advancing the lower material bar upward toward the lower end of the rotating upper material bar while rotating the lower material bar in the direction opposite to the direction of rotation of the upper material bar;

advancing the rotating lower material bar into contact with the lower end of the rotating upper material bar, thereby forming a stable floating molten zone at the region of contact of the two bars; and downwardly moving the rotating upper and lower material bars that are in contact with each other so that the stable floating molten zone that has been established gradually moves upward through the upper material bar, thereby resulting in the growth of a single crystal of gallium iron oxide.

2. The method of manufacturing a single crystal of gallium iron oxide according to claim 1, wherein the gallium iron oxide single crystal has the formula: $Ga_{2-x}Fe_xO_3$, wherein $0.7 \leq x \leq 1.5$ and has an orthorhombic crystal structure.

3. The method of manufacturing a single crystal of gallium iron oxide according to claim 2, wherein the gallium iron oxide single crystal has the formula: $Ga_{2-x}Fe_xO_3$, wherein $0.7 \leq x \leq 1.5$, is formed in an atmosphere of oxygen, air or an inert gas at a pressure of three atmospheres and has an orthorhombic crystal structure.

4. The method of manufacturing a single crystal of gallium iron oxide according to claim 3, wherein, during the growth of the single crystal of gallium iron oxide, the rate of growth is 10 mm/hr or less and the resulting single crystal of the formula: $Ga_{2-x}Fe_xO_3$, has an orthorhombic crystal structure.

5. The method of manufacturing a single crystal of gallium iron oxide according to claim 4, wherein the material bar is advanced at a rate of 20 mm/hr or less and the resulting single crystal of the formula: $Ga_{2-x}Fe_xO_3$, has an orthorhombic crystal structure.

6. The method of manufacturing a single crystal of gallium iron oxide according to claim 2, wherein the gallium iron oxide single crystal has the formula: $Ga_{2-x}Fe_xO_3$, wherein $0.7 \leq x \leq 1.5$ is formed in an atmosphere of oxygen, air or an inert gas at a pressure of at least five atmospheres and has an orthorhombic crystal structure.

7. The method of manufacturing a single crystal of gallium iron oxide according to claim 6, wherein the rate of growth of the $Ga_{2-x}Fe_xO_3$ single crystal is 10 mm/hr or less, and the single crystal has an orthorhombic crystal structure.

8. The method of manufacturing a single crystal of gallium iron oxide according to claim 1, wherein the upper and lower material bars are cut from the same solid bar of gallium iron oxide.

9. The method of manufacturing a single crystal of gallium iron oxide according to claim 1, wherein the transparent tubular chamber is a quartz tube.

10. The method of manufacturing a single crystal of gallium iron oxide according to claim 1, wherein the light sources are halogen lamps.

11. The method of manufacturing a single crystal of gallium iron oxide according to claim 1, wherein the temperature of said floating molten zone is controlled so that the molten state can be stably maintained without downward flow of the molten oxide material that distorts the shape of the molten zone.

12. The method of manufacturing a single crystal of gallium iron oxide according to claim 11, wherein the temperature of the floating zone is maintained by control of the electric current to the light sources, maintaining an appropriate distance between end of the upper material bar and the top end of the lower material bar and the rate of descent of the joined material bars.

* * * * *